United States Patent
Chen et al.

(10) Patent No.: US 8,514,483 B2
(45) Date of Patent: Aug. 20, 2013

(54) DOPED LOW-TEMPERATURE PHASE BARIUM METABORATE SINGLE CRYSTAL, THE MANUFACTURING METHOD THEREOF AND WAVE CHANGING ELEMENTS THEREFROM

(75) Inventors: Changzhang Chen, Fujian (CN); Maochun Hong, Fujian (CN); Ding Li, Fujian (CN); Hainan Lin, Fujian (CN); Shicong Cai, Fujian (CN)

(73) Assignee: Fujian Institute of Research on the Structure of Matter, Chinese Academy of Sciences, Fujian (CN)

( * ) Notice: Subject to any disclaimer, the term of this patent is extended or adjusted under 35 U.S.C. 154(b) by 155 days.

(21) Appl. No.: 13/055,721

(22) PCT Filed: Oct. 8, 2008

(86) PCT No.: PCT/CN2008/072619
§ 371 (c)(1),
(2), (4) Date: Apr. 5, 2011

(87) PCT Pub. No.: WO2010/009597
PCT Pub. Date: Jan. 28, 2010

(65) Prior Publication Data
US 2011/0170174 A1    Jul. 14, 2011

(30) Foreign Application Priority Data
Jul. 25, 2008 (WO) .............. PCT/CN2008/001379

(51) Int. Cl.
*G02F 1/355* (2006.01)
*G02B 6/00* (2006.01)

(52) U.S. Cl.
USPC .......................... 359/328; 385/122; 359/326

(58) Field of Classification Search
USPC .............. 359/326–332; 385/122; 372/21–22
See application file for complete search history.

(56) References Cited

U.S. PATENT DOCUMENTS

| | | | |
|---|---|---|---|
| 5,833,939 A | 11/1998 | Kimura et al. |
| 6,153,125 A | 11/2000 | Kimura et al. |

FOREIGN PATENT DOCUMENTS

| | | |
|---|---|---|
| CN | 1045282 A | 9/1990 |
| CN | 1086552 A | 5/1994 |

(Continued)

OTHER PUBLICATIONS

International Search Report (PCT/ISA/210) issued on Feb. 19, 2009, by Chinese Patent Office as the International Searching Authority for International Application No. PCT/CN2008/072619.

*Primary Examiner* — Daniel Petkovsek
(74) *Attorney, Agent, or Firm* — Buchanan Ingersoll & Rooney PC (57) ABSTRACT

The present invention relates generally to the field of synthetic crystal, and more particularly, this invention relates to doped low-temperature phase barium metaborate single crystal, growth method and frequency-converter. Molten salt method was adopted. The single crystal completely overcome the shortcomings of BBO with strong deliquescence, almost no deliquescence; its frequency doubling effect and optical damage threshold has improved greatly compared with the BBO; its hardness increased significantly, the single crystal with Shore hardness of 101.3 and Mohs hardness of 6, however, BBO with Shore hardness of 71.2 and Mohs hardness of 4. From the UV-Vis region transmittance curves tests, the cut-off wavelength of the single crystal is 190 nm, wavelength of absorption onset is 205 nm. BBSAG is widely applied in the fields of laser and nonlinear optics, and in terms of frequency-converter of ultraviolet and deep-ultraviolet due to its excellent properties better than BBO.

17 Claims, 3 Drawing Sheets

(56) References Cited

FOREIGN PATENT DOCUMENTS

| | | | |
|---|---|---|---|
| CN | 1118023 | A | 3/1996 |
| CN | 1443879 | A | 9/2003 |
| JP | 1-197395 | A | 8/1989 |
| JP | 9-157089 | A | 6/1997 |
| JP | 2000221552 | A * | 8/2000 |

* cited by examiner

DOPED LOW-TEMPERATURE PHASE BARIUM METABORATE SINGLE CRYSTAL, THE MANUFACTURING METHOD THEREOF AND WAVE CHANGING ELEMENTS THEREFROM

FIELD OF THE INVENTION

The present invention relates generally to the field of synthetic crystal, and more particularly, to a doped low-temperature phase barium metaborate single crystal, manufacturing method thereof and frequency-converter therefrom.

BACKGROUND OF THE INVENTION

In 1979, based on the conception of combining organic chemistry with inorganic chemistry, it is introduced into the field of inorganic chemistry by the inventor that the asymmetric distribution of electron cloud caused by organic aromatic conjugated $\pi$-bond charges being attracted and repelled each other generates dipole moment, and thus nonlinear optical effect is generated, And the inventor proposes a concept of finding "similar to the benzene ring" and "boron-oxygen ring" in the field of inorganic chemistry. Microcrystalline powder sample of low-temperature phase barium metaborate (BBO) is occasionally obtained by 68 times experiments through grinding and mixing the main component of $\alpha$-BBO (boron-oxygen ring), alkali metal and alkaline-earth metal carbonate and sintering the different metal compounds with different ratios. The frequency doubling effects of $\alpha$-BBO is about 5 times of the one of the KDP. Hereon natrium plays the role of flux. However, it was mistaken for sodium barium metaborate according to the design concept at that time [Reference: Changzhang CHEN, Dongshou GAO and Chuangtian CHEN, Explore of New type Nonlinear Optical Materials—-Boron-Oxygen ring Compounds, *National Conference on Crystal Growth and Materials, B*, 1979, B44:107-111.]. The sample is later identified as $\beta$-BBO through the phase diagram and X-ray diffraction analysis [Reference: Shaofang L U, Meiyun H E and Jinling HUANG, Crystal structure of the Low temperature form of barium barate $Ba_3(B_3O_6)_2$, *Acta Physica Sinica*, 1982, 31(7), 948-955].

$\beta$-BBO is generally prepared by the method of synthetic crystal comprising melting method and czochralski method. In order to obtain larger $\beta$-BBO single crystal with an excellent comprehensive property, which is applied to various frequency-converter, the preparation method of BBO has been trying to be improved.

$\beta$-BBO prepared by melting method in prior art is as follows:

Growth of $\beta$-BBO single crystal using flux seeding method is disclosed in CN85101617.0. The method comprises three steps: mixing materials, seeding crystallon and growing. Wherein $Na_2O$ or NaF is employed as an auxiliary flux; the crystallon is placed at the surface of the melted liq.; the orientation of crystallon is in the direction of C-axis; and the crystallon grows with a speed of 0.03 deg. C. per hour to 0.2 deg. C. per hour. A bowl shaped large single crystal with $\Phi67$ mm and a central depth up to 15 mm and can be steadily grown using this method.

Growth of $\beta$-BBO crystal using improved flux seed method is disclosed in CN92112921.1. The method comprises four steps: mixing materials, seeding crystallon, growing and taking out of furnace. Wherein the seed crystal is drilled at its center and a rod is screwed or inserted in the hole to fix the seed. The angle between the orientation of seed crystal and C-axle is from 0 to 60. The cooling rate is from 0.01 to 0.1° C./h and the rotating rate of crystal is from 0 to 30 r/min. Tapping method could comprise directly lifted annealing or converter pouring. High-quality, transparent and large single crystal with $\Phi80\sim150$ mm and center thickness of $25\sim35$ mm can be stably grown using the improving method.

It is crucial in growth process of low-temperature phase barium metaborate ($\beta$-BBO) large single crystal using air-cooled crystal method disclosed in CN98104745.9, that a compressed air is continuously blown on the upper surface of the growing crystal through conduct when $\beta$-BBO crystal using molten-salt czochralski method or flux seeding method is growing. Continuously cooling the crystal surface results in accelerating the dispersion of crystallization heat produced by crystallization and the impurity-discharging process at crystal growing interface, thus growing rate and quality of crystal is improved. The growth speed of $\beta$-BBO crystal rises by 3 to 5 times by using the improved method, namely 1.5 to 2.5 mm/d. UV transmissivity (200-340 mm) of the crystal is raised by 10%, namely up to above 80%.

$\beta$-BBO growing method for single crystal using melting method is disclosed in JP1197395. The crystal is prepared by depositing the molten salts of barium chloride and boric acid. Wherein the crystal is crushed, and formed by the rubber-press method; the formed product is primarily sintered at 750-850 deg. C. in an oxygen atmosphere; and the sintered product is crushed, formed, and sintered at 850-1095 deg. C. to obtain the raw rod for producing $\beta$-BBO single crystal. The title crystal is grown under the raw rod at <920 deg. C. in a solvent consisting of 25-35 mol % BaO, 40-50 mol % $B_2O_3$ and 20-30 mol % $Na_2O$. The growth rate is preferably controlled to 0.1-0.3 mm/h.

Czochralski method in prior arts is as follows:

CN90102894.0 discloses Czochralski method for a $\beta$-BBO single crystal with constant fluid level, in which material is intermittently fed by servo-crucible connected with growing-crucible, to achieve feeding and pulling simultaneously. Constant temperature during the growing process results in crystal with good perfection, high transparency, and less inclusions. The yield is significantly increased by the advantage of crystal such as large size etc. The method is again improved in CN94112294.

$\beta$-BBO single crystal is widely applied in the fields of laser and nonlinear optics and frequency-converter of ultraviolet and deep-ultraviolet due to its excellent nonlinear optical and thermoelectric properties. However, frequency doubling effect of the coated $\beta$-BBO single crystal is still significant attenuated due to its highly deliquescence after a period of using in the humid air; in addition, $\beta$-BBO is often broke in processing because its hardness is not enough big. So it is necessary that frequency doubling effect of coated $\beta$-BBO single crystal is further improved, and optical damage threshold of 13-BBO also is improved.

SUMMARY OF THE INVENTION

An object of the invention is to provide a doped low-temperature phase barium metaborate single crystal which can overcome the shortage of deliquescence of $\beta$-BBO, and enhance frequency doubling effect, and of which hardness and optical damage threshold are higher than the one of $\beta$-BBO.

Another object of the invention is to provide a manufacturing method for doped low-temperature phase barium metaborate single crystal. The manufacturing method comprises molten salt method or flux czochralski method, and large single crystal can be prepared by the method.

Another object of the invention is to provide a frequency-converter prepared by doped low-temperature phase barium metaborate single crystal.

In order to achieve the purpose of the invention, the technology scheme is as follows:

A doped low-temperature phase barium metaborate being a β-BBO single crystal doped with one or more elements selected from Si, Al and Ga, and chemical formula of the β-BBO single crystal being $Ba_{1-x}B_{2-y-z}O_4$—$Si_xAl_yGa_z$, wherein x is 0 to 0.15, y is 0 to 0.10, and z is 0 to 0.04, wherein x, y and z are not simultaneously 0.

The doped β-BBO single crystal of the invention belongs to a trigonal system with $C_3^4$—$R_3$, and unit cell parameter is a=b=12.5315 (15) Å, c=12.7147 (30) Å, Z=6, α=β=90°, γ=120° in hexagonal coordinate.

In the doped β-BBO single crystal of the invention, doped elements can be combination of Si, Al and Ga; preferably doped elements are combination of any two elements of Si, Al and Ga; preferably doped elements are any one elements of Si, Al and Ga. Wherein, more preferably doped elements are simultaneously doped with three elements of Si, Al and Ga.

The doped β-BBO single crystal is a low-temperature phase barium metaborate single crystal.

In order to achieve another purpose of the invention, the technology scheme is as follows:

A manufacturing method for a doped low-temperature phase barium metaborate single crystal includes but not limited to the growth methods for single crystal disclosed in prior arts, especially any growth methods for β-BBO; preferably molten salt method or flux czochralski method.

The molten salt method comprises the following steps:

(1) adding raw materials and flux to crucible and obtaining material mixture, the raw materials being barium compounds, boron compounds and one or more compounds containing the elements of Si, Al and Ga respectively;

(2) heating the material mixture in step (1) to a temperature higher than initial growth temperature of the crystal by 20 to 100° C., and overheating for 5 to 30 days;

(3) Cooling to a temperature higher than initial growth temperature of the crystal by 10 to 30° C., then putting seed rod or seed rod with seed crystal into melt; keeping constant temperature for 10 to 30 minutes, then cooling to a temperature higher than initial growth temperature of the crystal by 0 to 10° C.;

(4) rotating seed rod at the rate of 5 to 30 rpm, at the meantime, cooling at the rate of 0.1 to 3° C./d; and stopping rotating after cooling for 5 to 30 day;

(5) continuing to cool at the rate of 0.1 to 3° C./d in condition of seed rod being static state, and taking grown single crystal away from melt surface when single crystal grows to the required size.

The initial growth temperature of the crystal refers to a temperature in condition of a crystal in melt not being fusing and growing. The initial growth temperature of the crystal of the invention is in range of 730 to 930° C.

Particularly, molten salt method in the invention comprises the following steps:

(1) grinding and mixing raw materials and flux in certain ratio, and pouring mixture of raw materials into a platinum crucible after melting, then the platinum crucible being put in molten salt furnace; the raw materials being barium carbonate, boracic acid and at least one or more compounds selected from silicon compounds, aluminum compounds and gallium compounds;

(2) overheating at a temperature higher than initial growth temperature of the crystal by 20 to 100° C. for 5 to 30 days, then putting seed rod or seed rod with seed crystal into melt after cooling to a temperature higher than initial growth temperature of the crystal by 10 to 30° C. slowly, and keeping constant temperature for 10 to 30 minutes, and again cooling to a temperature higher than initial growth temperature of the crystal by 0 to 10° C., then single crystals immediately beginning to grow, and rotating seed rod at the rate of 5 to 30 r/min; simultaneously, cooling at the rate of 0.1 to 3° C./day; stopping rotating and statically growing after cooling for 5 to 30 days, and continuing to cooling at the rate of 0.1 to 3° C./day, and stopping heating when single crystal grows to the required size, and grown single crystal being taken away from melt surface and being slowly cooled to room temperature.

In the invention, the flux czochralski method comprises the following steps:

(1) adding raw materials and flux to crucible and obtaining material mixture, the raw materials being barium compounds, boron compounds and one or more compounds containing the elements Si, Al or Ga respectively;

(2) heating the material mixture in step (1) to a temperature higher than initial growth temperature of the crystal by 20 to 100° C., and overheating for 5 to 30 days;

(3) after cooling a temperature higher than initial growth temperature of the crystal by 10 to 30° C., seed rod with seed being connected with crystal-supported rod of rotating pulling motor, and put in melt; keeping constant temperature for 10 to 30 minutes at a temperature higher than initial growth temperature of the crystal by 10 to 30° C., then cooling to a temperature higher than initial growth temperature of the crystal by 0 to 10° C.; then single crystal immediately beginning to still growing;

(4) at the same time, cooling at the rate of 0.1 to 3° C. per day; cooling for 5 to 30 days, rotating seed rod at the rate of 6 to 30 r/min and pulling up 0.2 mm everyday, and continuing to cool at the rate of 0.1 to 3° C. per day, single crystal growing to the required size, and being taken away from melt surface.

Particularly, flux czochralski method in present invention comprises the following steps:

(1) grinding and mixing raw material and flux in certain ratio, and pouring mixture of raw materials into platinum crucible after melting, then platinum crucible being put in molten salt furnace; the raw material being barium carbonate and boracic acid, and one or more compounds selected from the group consisting of silicon compounds, aluminum compounds or gallium compounds;

(2) overheating for 5 to 30 days at a temperature higher than initial growth temperature of the crystal by 20 to 100° C., then seed rod with seed being connected with crystal-supported rod of rotating pulling motor and slowly put in melt after slowly cooling to a temperature higher than initial growth temperature of the crystal by 10 to 30° C.; keeping constant temperature for 10 to 30 minutes at a temperature higher than initial growth temperature of the crystal by 10 to 30° C., then cooling to a temperature higher than initial growth temperature of the crystal by 0 to 10° C., single crystal beginning to statically grow; simultaneously, cooling at the rate of 0.1 to 3° C. per day; cooling for 5 to 30 days, seed rod being rotated at the rate of 6 to 30 r/min, and being pulled up by 0.2 mm everyday, and continuing to cool at the rate of 0.1 to 3° C. per day, stopping heating when single crystal growing to the required size, and grown single crystal being taken away from melt surface and being cooled to room temperature slowly.

In present invention, the barium compounds as material are barium carbonate or barium chloride, the boron compounds are boric acid or boron oxide. The flux are carbonate or fluoride, or mixture of carbonate and fluoride; preferably one or more compounds selected from the group consisting of potassium carbonate, sodium carbonate, lithium carbonate or barium carbonate. Flux can also be fluoride, including but not limited to one or more compounds selected from the group consisting of lithium fluoride, sodium fluoride, potassium fluoride or barium fluoride.

In present invention, the molar ratio of carbonate as flux to barium compounds in raw materials is (0~0.5):1; the molar ratio of fluoride as flux to barium compounds in raw materials is (0~0.5):1; the molar ratio of carbonate and fluoride in flux and barium compounds in raw materials is (0~0.5):(0~0.5):1 when mixture of carbonate and fluoride is used as flux; carbonate; the feed molar ratio of barium compounds, boron compounds, silicon compounds, aluminum compounds and gallium compounds is 1:(1.5~3.0):(0~0.20):(0~0.15):(0~0.06), and three quantities of silicon compounds, aluminum compounds and gallium compounds can not simultaneously be zero.

In present invention, the silicon compounds are silicon dioxide or silicic acid; the aluminum compounds are aluminum oxide, aluminum hydroxide, aluminum nitrate or aluminum chloride; the gallium compounds are gallium oxide, gallium hydroxide, gallium nitrate or gallium trichloride.

The present invention relates further to frequency-converter prepared by doped β-BBO single crystal. The frequency-converter is double frequency-converter, triplicate frequency-converter or fourfold frequency-converter.

The included angle between light pass surface of the double frequency-converter and crystal growth surface perpendicular to the C-axis is an arbitrary angle in the range of 14.5° to 22.5°, and two pass surfaces are polished. The included angle between light pass surfaces of the triplicate frequency-converter and crystal growth surfaces perpendicular to the C-axis is an arbitrary angle in range of 24° to 32°, and two pass surfaces are polished. The included angle between light pass surfaces of the fourfold frequency-converter and crystal growth surfaces perpendicular to the C-axis is any angle in range of 43° to 51°, and two pass surfaces are polished.

Figure 3:
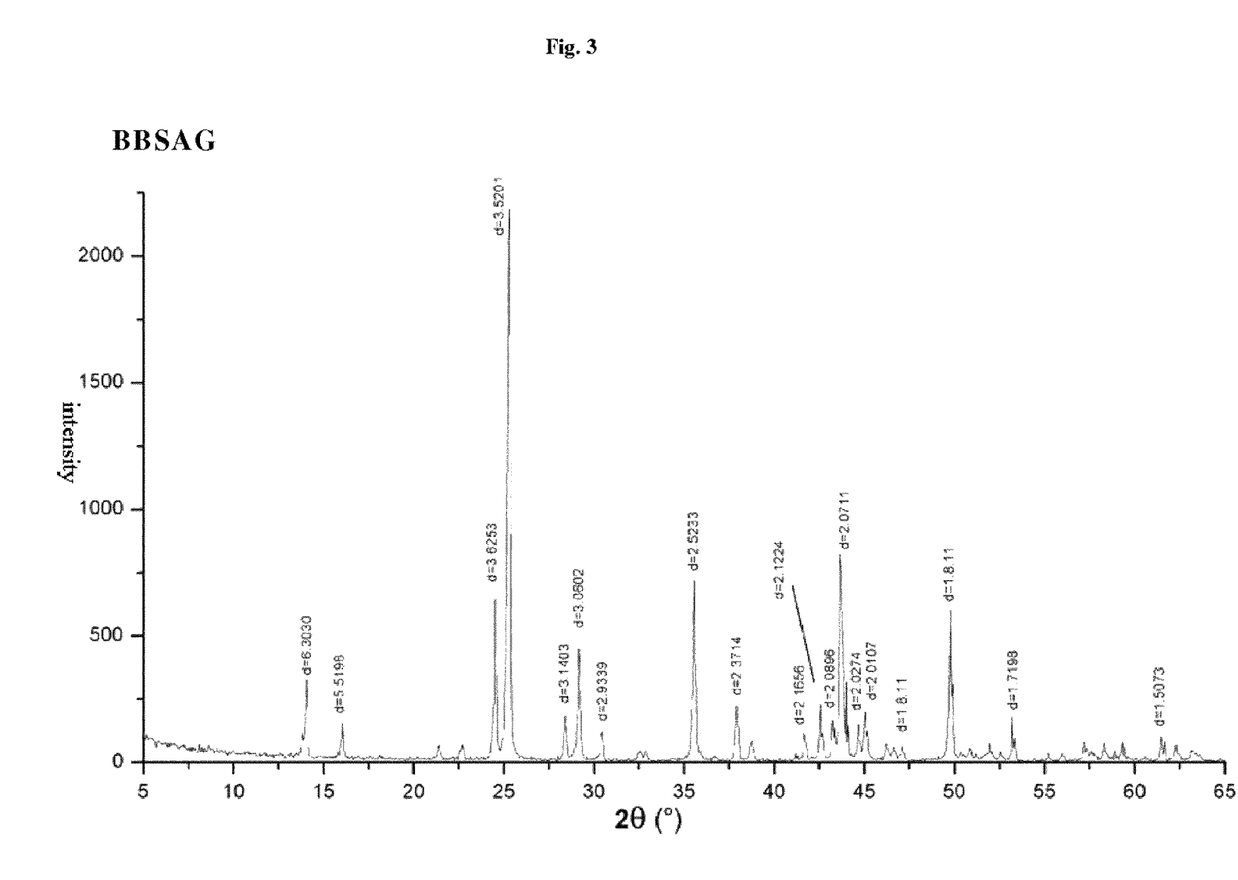
FIG. 3 is X-ray diffraction diagrams of the powder of grown BBSAG single crystal of the invention.

According to X-ray diffraction (as shown in FIG. 3), it can be seen that the crystal structure of BBSAG which is an abbreviation for doped β-BBO prepared by molten salt method and flux czochralski method of the invention in principle conforms with the β-BBO; according to plasma emission spectroscopy, it can be seen that β-BBO dopes with silicon, aluminum and gallium.

Nonlinear optical effect is usually caused by static dipole moment and dynamic dipole moment, moreover dynamic dipole moment is very important. Conjugated π electrons of boron and oxygen concentrate on oxygen atoms in boron-oxygen ring of β-BBO, and the electron cloud of oxygen atoms flows to barium, thus generates dynamic dipole moment, it's the key that β-BBO generates large nonlinear optical effect. In doped β-BBO, because 3p and 4p electronic potential energy of any doped element selected from silicon, aluminum and gallium is higher than 2p electronic potential energy of boron, in conjugated π electron of them and the oxygen atom, the electron cloud concentrating on oxygen atoms will be more, thus electron cloud flowing to barium ion from oxygen atoms will be more, and the dynamic dipole moment will be bigger. Secondly, part of the dopant such as silicon, aluminum, gallium atom enters the gap, and these atoms become cations, further, these cations will pull in the electron cloud concentrating on oxygen atoms of boron-oxygen ring, thus also increases the dynamic dipole moment. Therefore, β-BBO is doped whether with one element selected from the group consisting of silicon, aluminum and gallium, or the combination of two elements thereof, or the combination of three elements thereof, the frequency doubling effect thereof is relatively more than β-BBO.

In addition, due to highly deliquescence of β-BBO, though it suffers from coating process, the frequency doubling effect of β-BBO still significant attenuates after a period of using in the humid air; β-BBO often breaks in processing because its hardness is not big enough; the frequency doubling effect of β-BBO need to further improve; and optical damage threshold of β-BBO also need to be improved, and the like. In view of various shortcomings of β-BBO, β-BBO was doped to overcome and improve the shortcomings of β-BBO.

BBSAG single crystals have excellent nonlinear optical properties and thermoelectric properties like β-BBO, and completely overcome the disadvantage of β-BBO with strong deliquescence, at the same time, improve some performance of β-BBO, such as the frequency doubling effect increasing, optical damage threshold improving, and hardness remarkably improving. Because of increased hardness, cracking of β-BBO during processing is overcome. Due to its excellent properties superior to that of β-BBO, BBSAG can be applied in large-scale and have greater prospects for industrialization. BBSAG of the invention is widely applied in the fields of laser and nonlinear optics, and in terms of frequency-converter of ultraviolet and deep-ultraviolet.

In order to understand technical scheme and technical effect of the invention, the following will further describe the invention combining with examples. Needless to say, the invention is not limited by the following examples.

DETAILED DESCRIPTION OF PREFERRED EMBODIMENTS

After the nonlinear optical effect was discovered by the inventor and Dongshou GAO, it is further recognized that the nonlinear optical effect is usually caused by static dipole moment and dynamic dipole moment, and the later is particularly important. The static dipole moment is usually intrinsic dipole moment in physics. The dynamic dipole moment means that the atoms such as oxygen atom enrich electron cloud with delocalization, and the electron cloud flows to cation such as barium ion again. Thus, the dynamic dipole moment is generated. And the dynamic dipole moment generates bigger frequency doubling effect, such as β-BBO. The improvements of β-BBO doped silicon, aluminum and gallium in the invention depend on following reasons: because 3p and 4p electronic potential energy of element selected from silicon, aluminum and gallium is higher than 2p electronic potential energy of boron, the electron cloud concentrating on oxygen atoms will be more, and electron cloud flowing to barium ion from oxygen atom will be more, as a result, the dynamic dipole moment will be bigger. Secondly, even if part of the doped atoms such as silicon, aluminum, gallium enter into the gap and become cations, these cations will pull in the electron cloud concentrating on oxygen atoms, and the dynamic dipole moment is also increased. Therefore, the frequency doubling effect of low-temperature phase barium metaborate single crystal doped with silicon, aluminum and gallium is bigger than that of β-BBO.

Figure 2:
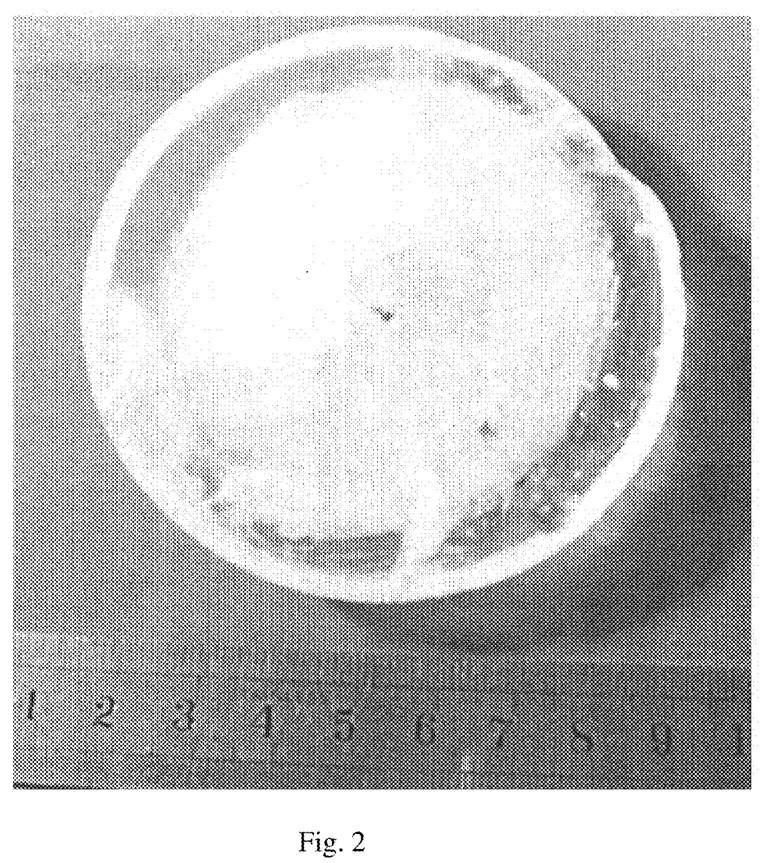
FIG. 2 is photos of grown BBSAG single crystal of the invention.

In invention, the chemical formula of single crystal is $Ba_{1-x}B_{2-y-z}O_4$—$Si_xAl_yGa_z$, in which x is 0 to 0.15, y is 0 to 0.10, z is 0 to 0.04, and x, y and z cannot simultaneously be zero, so low-temperature phase barium metaborate single crystal doped with silicon, aluminum and gallium contains at least one element selected from the group consisting of silicon, aluminum and gallium. X-ray diffraction diagrams of the powder of grown BBSAG of the invention shown in FIG. 3, doped β-BBO belong to trigonal system with $C_3^4$—$R_3$, and the unit cell parameter being a=b=12.5315 (15) Å, c=12.7147 (30) Å, Z=6, α=β=90°, γ=120° in hexagonal coordinate. This crystal structure can be a layer step of lattice built interlaced up by $Ba^{2+}$ and $(B_3O_6)^{3-}$ rings, wherein the anion $(B_3O_6)^{3-}$ ring is nearly planar. The plane is perpendicular to the three-fold axis; each barium atom is adjacent to seven oxygenes. The acentric symmetry of the barium cations in this structure changes the electron density distribution of the anion conjugated boron-oxygen rings. FIG. 2 is the photo of BBSAG of the invention.

Regarding the frequency-converter, fivefold frequency-converter mean that let 355 nm laser output by triplicate frequency-converter and 532 nm laser output by double frequency-converter, and the two lasers are simultaneously incident on fivefold frequency-converter to generate sum frequency, thus produce laser output with wave length of 213 nm.

Regarding sixfold frequency-converter, let triplicate frequency-converter output laser, and the laser is output through sixfold frequency-converter, namely laser output by sixfold frequency-converter.

In invention, boracic acid is $H_3BO_3.H_2O$, aluminum nitrate is $Al(NO_3)_3.9H_2O$, and gallium nitrate is $Ga(NO_3)_3.H_2O$.

Example 1

Figure 1:
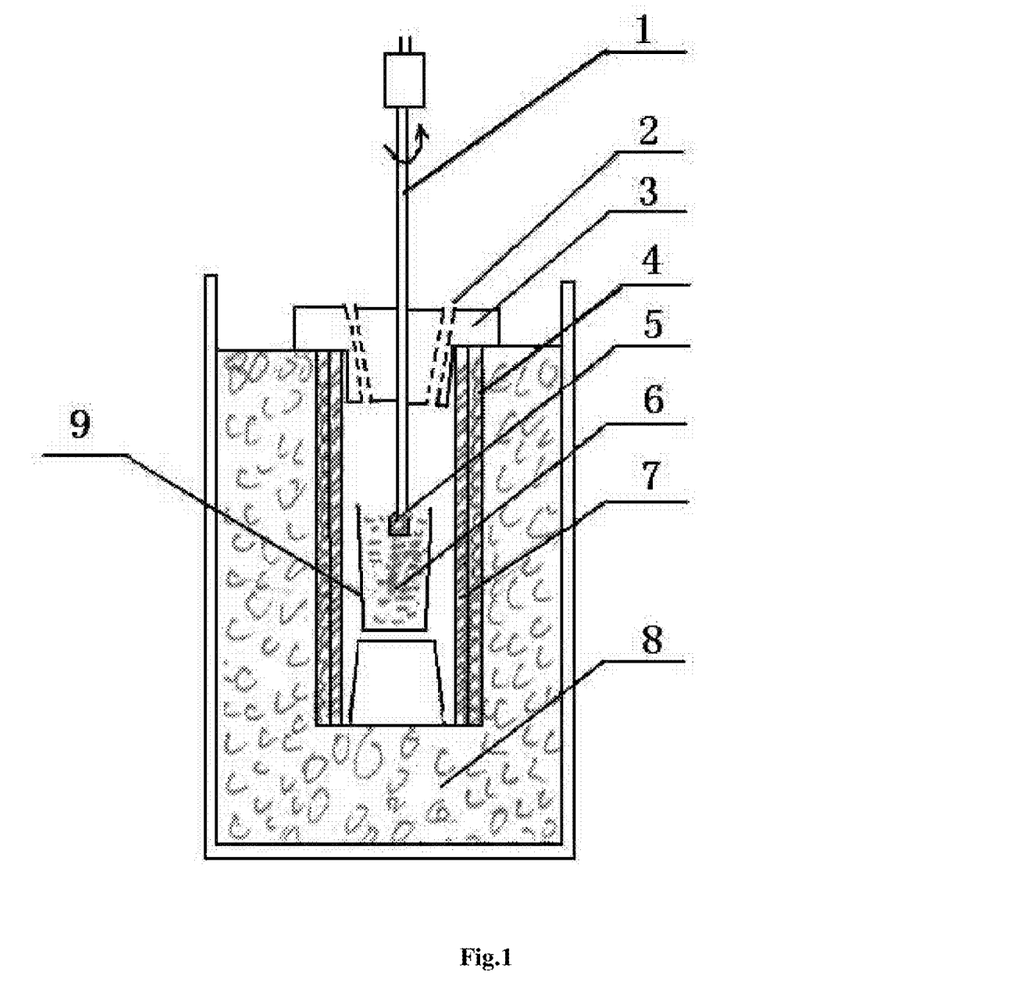
FIG. 1 is schematic view of single crystal growth furnace using molten salt method in invention, among which, 1 seed rod, 2 observation window, 3 furnace lid, 4 nickel chrome wire heater, 5 seed crystal, 6 high-temperature melt, 7 alundum tube, 8 insulating material, 9 platinum crucible.

In present invention, the device of single crystal growth shown in FIG. 1 includes: seed rod 1, observation window 2, furnace lid 3, nickel chrome wire heater 4, seed crystal 5, high-temperature melt 6, alundum tube 7, insulating material 8, and platinum crucible 9.

750 g of barium carbonate, 587 g of boric acid, 41.0 g of silicon dioxide, 38.6 g of aluminum oxide, 42.8 g gallium oxide, 79.8 g of sodium fluoride and 4.93 g of lithium fluoride are grinded and mixed, melted many times, and poured into platinum crucible 9, first overheated to 980° C., kept temperature for 15 days, then cooled to 950° C., and seed rod 1 with seed crystal 5 is put in high-temperature melt 6 slowly. Keeping temperature 0.5 hour, and cooling to 933° C., then single crystal beginning to grow. Starting rotation device, seed rod 1 rotates with 8 rpm, at the same time, beginning to cool slowly with the rate of 1.1° C. per day, and stopping rotating on the 25th day, and growing statically, and continuing to cool with the same rate. Stopping heating when growing time of single crystal up to 100th day, single crystal is took away from melt surface, and slowly cooled to room temperature, and the BBSAG with Φ76×13 mm and weight of 205 g is obtained. It is confirmed from the result of the X-ray diffraction analysis that the single crystal belongs to trigonal system with $C_3^4$—$R_3$, and unit cell dimensions is a=b=12.5315 (15) Å, c=12.7147 (30) Å, Z=6, α=β=90°, γ=120° in hexagonal coordinate. According to ICP-AES, the formula of single crystal is $Ba_{1-x}B_{2-y-z}O_4$—$Si_xAl_yGa_z$, in which x is 0.13, y is 0.08, and z is 0.03.

Example 2

600 g of barium carbonate, 282 g of boric acid, 36.5 g of silicon dioxide, 114 g of aluminum nitrate with nine crystal water, 28.4 g of gallium oxide, 161 g of sodium carbonate, and 266.3 of barium fluoride are grinded and mixed, melted many times, and poured into platinum crucible, first overheated to 800° C., kept temperature for 10 days, then cooled to 750° C., and seed rod with seed crystal is put in high-temperature melt slowly. Keeping temperature 0.5 hour, and cooling to 738° C., then single crystal begins to grow. Starting rotation device, seed rod rotates with 9 rpm, at the same time, beginning to cool slowly with the rate of 1° C. per day, stopping rotating on the twentieth day, and growing statically, and continuing to cool with the same rate. Single crystal stopping growing when growing time of single crystal up to 100 days, namely stopping heating, and single crystal is took away from melt surface, and slowly cooled to room temperature and took out, thus the BBSAG with Φ75×12 mm as shown in FIG. 2 is obtained. According to ICP-AES, the formula of single crystal is $Ba_{1-x}B_{2-y-z}O_4$—$Si_xAl_yGa_z$, in which x is 0.15, y is 0.08, and z is 0.03.

Example 3

750 g of barium carbonate, 705 g of boric acid, 34.2 g of silicon dioxide, 171 g of aluminum nitrate, 80.6 g of sodium carbonate, 29.6 of lithium fluoride are grinded and mixed, melted many times, and poured into platinum crucible, first overheated to 880° C., kept temperature for 8 days, then cooled to 850° C., seed rod with platinum wire at the bottom is put in. Then cooling to 835° C., single crystal begins to grow. Starting rotation device, seed rod rotates with 7 rpm, at the same time, beginning to cool slowly with the rate of 1.0° C. per day, stopping rotating on the thirtieth day, and growing statically, and continuing to cool with the same rate. Stopping heating when growing time of single crystal up to 110 days, single crystal is took away from melt surface, and slowly cooled to room temperature, and the BBSAG with Φ76×12 mm is obtained. According to ICP-AES, the formula of single crystal is $Ba_{1-x}B_{2-y}O_4$—$Si_xAl_y$, in which x is 0.1, and y is 0.09.

Example 4

600 g of barium carbonate, 432 g of boric acid, 21.9 g of silicon dioxide, 8.33 g of gallium nitrate with one crystal water, 150 g of barium carbonate and 19.7 of lithium fluoride are grinded and mixed, melted many times, and poured into platinum crucible, then putting the crucible into molten salt furnace, first overheated to 850° C., kept temperature for 20 days, then cooled to 820° C., and seed rod with seed crystal is put in slowly. Keeping temperature 0.5 hour, and cooling to 805° C., then single crystal beginning to grow. Seed rod rotates with 15 rpm, at the same time, beginning to cool slowly with the rate of 1.2° C. per day, stopping rotating on the eighteenth day, and growing statically, and continuing to cool with the same rate. Stopping heating when growing time of single crystal up to 100 days, single crystal is took away from melt surface, and slowly cooled to room temperature, and the BBSAG with Φ75×15 mm is obtained. According to ICP-AES, the formula of single crystal is $Ba_{1-x}B_{2-z}O_4$—$Si_xGa_z$, in which x is 0.08, and z is 0.005.

Example 5

750 g of barium carbonate, 470 g of boric acid, 22.8 g of silicon dioxide, 22.5 g lithium carbonate and 67 g of sodium fluoride are grinded and mixed, melted many times, and poured into platinum crucible, first overheated to 950° C., kept temperature for 30 days, then cooled to 910° C., and seed rod with seed crystal is slowly put in high-temperature melt. Keeping temperature 0.5 hour, and cooling to 895° C., then single crystal begins to grow. Seed rod rotates with 12 rpm, at the same time, beginning to cool slowly with the rate of 1.3° C. per day, stopping rotating on the 30th day, and growing statically, and continuing to cool with the same rate. Stopped heating when growing time of single crystal up to 90 days, single crystal is took away from melt surface, and slowly cooled to room temperature, and the BBSAG with Φ74×16 mm is obtained. According to ICP-AES, the formula of single crystal is $Ba_{1-x}B_2O_4$—$Si_x$, in which x is 0.07.

Example 6

750 g of barium carbonate, 564 g of boric acid, 86 g of aluminum nitrate with nine crystal water, 201.4 g of sodium carbonate and 9.86 g of lithium fluoride are grinded and mixed, melted many times, and poured into platinum crucible, first overheated to 955° C., kept temperature for 25 days, then cooled to 930° C., and seed rod with seed crystal is slowly put in. Keeping temperature 0.5 hour, and cooling to 920° C., then single crystal begins to grow. Seed rod rotates with 25 rpm, at the same time, beginning to cool slowly with the rate of 0.9° C. per day, stopping rotating on the 25th day, and growing statically, and continuing to cool with the same rate. Stopped heating when growing time of single crystal up to 115 days, single crystal is took away from melt surface, and slowly cooled to room temperature, and the BBSAG with Φ75×18 mm is obtained. According to ICP-AES, the formula of single crystal is $BaB_{2-y}O_4$—$Al_y$, in which y is 0.04.

Example 7

600 g of barium carbonate, 414 g of boric acid, 50.1 g of gallium nitrate with one crystal water, 63.8 g of sodium fluoride and 26.7 g of barium fluoride are grinded and mixed, melted many times, and poured into platinum crucible, first overheated to 970° C., kept temperature for 30 days, then cooled to 940° C., and seed rod with seed crystal is slowly put in. Keeping temperature 0.5 hour, and cooling to 930° C., then single crystal begins to grow. Seed rod rotates with 16 rpm, at the same time, beginning to cool slowly with the rate of 0.8° C. per day, stopping rotating on the 28th day, and growing statically, and continuing to cool with the same rate. Stopped heating when growing time of single crystal up to 110 days, single crystal is took away from melt surface, and slowly cooled to room temperature and took out, and the BBSAG with Φ73×15 mm is obtained. According to ICP-AES, the formula of single crystal is $BaB_{2-z}O_4$—$Ga_z$, in which z is 0.04.

Example 8

750 g of barium carbonate, 587 g of boric acid, 214 g of aluminum nitrate with nine crystal water, 20.8 g of gallium nitrate with one crystal water, 101 g of sodium carbonate and 37.5 g of barium carbonate are grinded and mixed, melted many times, and poured into platinum crucible, first overheated to 945° C., kept temperature for 24 days, then cooled to 915° C., and seed rod with seed is connected with crystal rod supported rotating pulling motor and slowly put in. Keeping temperature 0.5 hour, and cooling to 903° C., then single crystal begins to grow statically, at the same time, to cool slowly with the rate of 0.9° C. per day. On the 30th day of cooling, seed rod is rotating and pulling up 0.2 mm everyday, and continuing to cool with the same rate. Stopped heating when growing time of single crystal up to 110 days, single crystal is took away from melt surface, and slowly cooled to room temperature and took out, and the BBSAG with Φ75×14 mm is obtained. According to ICP-AES, the formula of single crystal is $BaB_{2-y-z}O_4$—$Al_yGa_z$, in which y is 0.1, and z is 0.012.

Example 9-15

In examples 9-15, BBSAG single crystal is prepared by using experimental parameters of examples 1-7 and preparation steps of example 8.

Example 16

BBSAG single crystal is prepared by using the other parameters described in example 1, except for changing silicon dioxide to silicic acid with the same molar ratio.

Example 17

BBSAG single crystal blank of example 1 is cut into 5×5× 3.15 mm cuboid, and the included angle between light pass surfaces and crystal growth surfaces perpendicular to the C-axis is any angle of 14.5°~22.5°, two pass surfaces are polished, thus double frequency-converter is made. A laser beam with 1064 nm wavelength is incident on double frequency-converter of BBSAG along the direction of light perpendicular to light pass surfaces, and double frequency-converter is rotated a little, thus the laser output of maximum intensity with 532 nm wavelength may be generated.

Example 18

BBSAG single crystal blank of example 1 is cut into 5×5× 3.15 mm cuboid, and the included angle between light pass surfaces and crystal growth surfaces perpendicular to the C-axis is any angle of 24°~32°, two pass surfaces are polished, thus triplicate frequency-converter is made. A laser beam with 1064 nm wavelength is first incident on second harmonic generation device of example 17, then the laser with 1064 nm and 532 nm wavelength is incident on triplicate frequency-converter of BBSAG along the direction of light perpendicular to light pass surfaces, and triplicate frequency-converter is rotated a little, thus the laser output with 355 nm wavelength may be generated.

Example 19

BBSAG single crystal blank of example 1 was cut into 4×4×2 mm cuboid, and the included angle between light pass surfaces and crystal growth surfaces perpendicular to the C-axis is any angle of 43°~51°, two pass surfaces are polished, thus the fourfold frequency-converter is made. A laser beam with 1064 nm wavelength is first incident on double frequency-converter of β-BBO with 3×3×8 mm, then the laser of 532 nm wavelength generated by β-BBO is incident on fourfold frequency-converter of BBSAG along the direction of light perpendicular to light pass surfaces, and fourfold frequency-converter is rotated a little, thus the laser output with 266 nm wavelength may be generated.

Experimental Example

1. Comparative Experiment of Deliquescence of Crystal

Testing deliquescence of BBSAG of example 1 and β-BBO of prior arts in constant humidity cabinet, conditions: relative humidity: 83~84% RH; temperature: 12~15° C.; time: 18 days for the first, 16 days for the second;

|  | first Maximum output light intensity of double frequency-converter (mean value of three times, arbitrary units) | | | second Maximum output light intensity of double frequency-converter (mean value of three times, Arbitrary units) | | | |
|---|---|---|---|---|---|---|---|
|  | Before constant humility experiment | After constant humility experiment | change rate | Before constant humility experiment | After constant humility experiment | change rate | Total change rate |
| BBSAG | $3.8 \times 10^3$ | $3.8 \times 10^3$ | 0 | $3.8 \times 10^3$ | $3.8 \times 10^3$ | 0 | 0 |
| β-BBO | $3.8 \times 10^3$ | $1.8 \times 10^3$ | fell by 53% | $1.8 \times 10^3$ | $1.1 \times 10^3$ | fell by 39% | fell by 71% |

Experimental result: the first, after 18 days of constant humility experiment, double frequency-converter of BBSAG didn't change, but double frequency-converter of β-BBO is fell by 53%. The second, after 16 days of constant humility experiment, double frequency-converter of BBSAG still didn't change, but double frequency-converter of β-BBO fell by 39% again. Total change rate, namely after 34 days of constant humility experiment, double frequency-converter of BBSAG didn't change, but double frequency-converter of β-BBO is fell by 71%. This shows that BBSAG completely overcomes the shortcomings of deliquescence of β-BBO, BBSAG could be used without coating.

Testing BBSAG single crystal of other example of present invention, the similar results are obtained.

2. Comparative Experimental Tests of Hardness of Crystals

Testing hardness of BBSAG single crystal of example 1 and β-BBO single crystal of prior arts, results are as follows:

| (1) Mohs hardness test: β-BBO | 4 | BBSAG | 6 |
|---|---|---|---|
| (2) Shore hardness test: β-BBO | 71.2 | BBSAG | 101.2 |

It will be seen that the hardness of BBSAG is significantly more than the one of β-BBO, broken shortcomings of β-BBO in the process is overcame. (C) 01-096 HS-19GDV Shore hardness tester is used in Shore hardness test.

Testing BBSAG single crystal of other example of present invention, the similar results are obtained.

3. Comparative Experimental Tests of Optical Damage Threshold

Testing optical damage threshold of BBSAG single crystal of example 1 and β-BBO single crystal of prior arts.

Experiment condition: electro-optic Q-switch YAG lasers, wavelength of 1064 μm, single pulse width of 7 nsA, single pulse energy of 895 mj. Transverse mode distribution is uniform flat-topped, focusing the laser output beam by focusing lens, spot diameter of Φ5, Φ3, Φ2.5, Φ2.2 and Φ2 are respectively obtained, its corresponding five spot areas are 0.19625 $cm^2$, 0.07665 $cm^2$, 0.04906 $cm^2$, 0.03799 $cm^2$ and 0.0314 $cm^2$ respectively.

Experimental results: Φ5 energy density E=4.56 $J/cm^2$, power density P=651.4 $MW/cm^2$; Φ3 energy density E=12.67 $J/cm^2$, power density P=1809.7 $MW/cm^2$; Φ2.5 energy density E=18.24 $J/cm^2$, power density P=2605.7 $MW/cm^2$; Φ2.2 energy density E=23.65 $J/cm^2$, power density P=3365.2 $MW/cm^2$; Φ2 energy density E=28.50 $J/cm^2$, power density P=4071.4 $MW/cm^2$; in two ranges of Φ5 and Φ3, BBSAG and BBO no damage; in two ranges of Φ2.5 and Φ2.2, BBSAG no damage; in the Φ2 range, BBSAG had damage; in the Φ2.5 range, BBSAG had damage.

Namely BBSAG had no damage till Φ2.2 energy density E=23.65 $J/cm^2$ and power density P=3365.2 $MW/cm^2$, BBO had no damage till Φ3 energy density E=12.67 $J/cm^2$ and power density P=1809.7 $MW/cm^2$. Conclusion: obviously, optical damage threshold of BBSAG is more than β-BBO.

Finishing machining of crystal surface is no good, if finishing machining of crystal surface is improved, both optical damage threshold will be further increased.

Moreover, because of matured process, good optical quality and almost no inclusions of β-BBO, but inclusions of BBSAG are more, if optical performance of BBSAG is improved, its optical damage threshold will be further improved.

Testing BBSAG single crystal of other example of present invention, the similar results are obtained.

4. Maximum Output Light Intensity of Frequency-Doubled Signal, Arbitrary Units Testing maximum output light intensity of frequency-doubled signal of BBSAG single crystal of example 1 and β-BBO single crystal of prior arts, in which crystal length of β-BBO and BBSAG are 3.17 mm and 3.15 mm respectively.

|  | first (output light intensity) | second (output light intensity) | third (output light intensity) | mean value (output light intensity) |
|---|---|---|---|---|
| β-BBO | $3.4 \times 10^3$ | $4.6 \times 10^3$ | $4.1 \times 10^3$ | $4 \times 10^3$ |
| BBSAG | $4.7 \times 10^3$ | $5.2 \times 10^3$ | $5.1 \times 10^3$ | $5 \times 10^3$ |

According to above digital information, double frequency effect of BBSAG is more than the one of β-BBO by 25%, however, because of matured process and good optical quality of β-BBO, optical performance of BBSAG needs to be further improved. There are inclusions in BBSAG crystal, in the visible-UV region transmittance testing curve, the maximum value of luminousness is about 80%, and thereby there is 20% energy degradation. If considering 20% energy degradation, then double frequency effect of BBSAG is more than the one of β-BBO by above 45%.

Testing BBSAG single crystal of other example of present invention, the similar results are obtained.

5. The Visible-UV Region Transmittance Testing Curve (Using BECKMAN DU650)

The cut off wavelength and wavelength of absorption onset of BBSAG of example 1 is 190 mm and 205 mm respectively.

6. Testing Doped Atoms of BBSAG

According to ICP-AES TE2000DV, it is determined that BBSAG contains silicon, aluminum and gallium, in which the molar ratio of Barium ions, silicon ions, aluminum ions and gallium ions is 1: (0~0.15):(0~0.1):(0~0.04).

The invention claimed is:

1. A doped low-temperature phase barium metaborate single crystal, being a β-BBO single crystal doped with Si, Al and Ga simultaneously, chemical formula of the single crystal being $Ba_{1-x}B_{2-y-z}O_4$—$Si_xAl_yGa_z$, wherein x is more than 0 to 0.15, y is more than 0 to 0.10, and z is more than 0 to 0.04.

2. The doped low-temperature phase barium metaborate single crystal according to claim 1, wherein the β-BBO belongs to a trigonal system with $C_3^4$—$R_3$, and unit cell parameters are a=b=12.5315 (15) Å, c=12.7147 (30) Å, Z=6, $\alpha=\beta=90°$, $\gamma=120°$ in hexagonal coordinate.

3. A preparation method for doped low-temperature phase barium metaborate single crystal according to claim 1, wherein the preparation method comprises utilizing a molten salt method or a flux czochralski method.

4. The preparation method for doped low-temperature phase barium metaborate single crystal according to claim 3, wherein the molten salt method comprises the following steps:
 (1) adding raw materials and a flux to a crucible and obtaining a material mixture, the raw materials being a barium compound, a boron compound, a silicon compound, an aluminum compound and a gallium compound;
 (2) heating the material mixture in step (1) to an initial growth temperature of the crystal, and overheating for 5 to 30 days at a temperature higher than the initial growth temperature of the crystal by 20 to 100° C. to obtain a melt;
 (3) cooling to a temperature higher than the initial growth temperature of the crystal by 10 to 30° C., then putting a seed rod or a seed rod with a seed crystal into the melt; keeping a constant temperature for 10 to 30 minutes, then cooling to a temperature higher than the initial growth temperature of the crystal by 0 to 10° C.;
 (4) rotating the seed rod at a rate of 5 to 30 rpm, at the same time, cooling at a rate of 0.1 to 3° C./d; and stopping rotating after cooling for 5 to 30 day;
 (5) continuing to cool at a rate of 0.1 to 3° C./d in condition of the seed rod being in a static state, and taking a grown single crystal away from a melt surface when the single crystal grows to a required size.

5. The preparation method for doped low-temperature phase barium metaborate single crystal according to claim 4, wherein the barium compound is barium carbonate or barium chloride, and the boron compound is boracic acid or boron oxide.

6. The preparation method for doped low-temperature phase barium metaborate single crystal according to claim 4, wherein the initial growth temperature of the crystal is 730 to 930° C.

7. The preparation method for doped low-temperature phase barium metaborate single crystal according to claim 4, wherein the flux is a carbonate or fluoride, or a mixture of a carbonate and a fluoride.

8. The preparation method for doped low-temperature phase barium metaborate single crystal according to claim 7, wherein the carbonate comprises one or more compounds selected from the group consisting of potassium carbonate, sodium carbonate, lithium carbonate and barium carbonate; and the fluoride comprises one or more compounds selected from the group consisting of lithium fluoride, sodium fluoride, potassium fluoride and barium fluoride.

9. The preparation method for doped low-temperature phase barium metaborate single crystal according to claim 7, wherein a molar ratio of the carbonate as the flux to the barium compound in the raw materials is (0~0.5):1; a molar ratio of the fluoride as the flux to the barium compound in the raw materials being (0~0.5):1; a molar ratio of the carbonate and the fluoride in the flux and the barium compound in the raw materials is (0~0.5):(0~0.5):1 when the mixture of the carbonate and fluoride is used as the flux.

10. The preparation method for doped low-temperature phase barium metaborate single crystal according to claim 4, wherein a feed molar ratio of the barium compound, the boron compound, the silicon compound, the aluminum compound and the gallium compounds is 1:(1.5~3.0):(0~0.20):(0~0.15): (0~0.06), none of three quantities of the silicon compound, the aluminum compound and the gallium compound being zero.

11. The preparation method for doped low-temperature phase barium metaborate single crystal according to claim 4, wherein the silicon compound is silicon dioxide or silicic acid; the aluminum compound is aluminum oxide, aluminum hydroxide, aluminum nitrate or aluminum chloride; and the gallium compound is gallium oxide, gallium hydroxide, gallium nitrate or gallium trichloride.

12. The preparation method for doped low-temperature phase barium metaborate single crystal according to claim 3, wherein the flux czochralski method comprises the following steps:
 (1) adding raw materials and a flux to a crucible and obtaining a material mixture, the raw materials being a barium compound, a boron compound, a silicon compound, an aluminum compound and a gallium compound;
 (2) heating the material mixture in step (1) to an initial growth temperature of the crystal, and overheating for 5 to 30 days at a temperature higher than the initial growth temperature of the crystal by 30 to 100° C. to obtain a melt;
 (3) after cooling a temperature higher than the initial growth temperature of the crystal by 10 to 30° C., a seed rod with a seed being connected with a crystal-supported rod of a rotating pulling motor, and put in the melt; keeping a constant temperature for 10 to 30 minutes at a temperature higher than the initial growth temperature of the crystal by 10 to 30° C., then cooling to a temperature higher than the initial growth temperature of the crystal by 0 to 10° C.; then a single crystal immediately beginning to statically grow;
 (4) at the same time, cooling at a rate of 0.1 to 3° C. per day; cooling for 5 to 30 days, rotating the seed rod at a rate of 6 to 30 r/min and pulling the seed rod up by 0.2 mm everyday, and continuing to cool at a rate of 0.1 to 3° C.

per day, the single crystal growing to a required size, and being taken away from a melt surface.

13. The preparation method for doped low-temperature phase barium metaborate single crystal according to claim 3, wherein the molten salt method comprises the following steps:
(1) grinding and mixing raw materials and a flux in a certain ratio to obtain a mixture, and pouring the mixture into a platinum crucible after melting, then the platinum crucible being put in a molten salt furnace to obtain a melt; the raw materials being barium carbonate, boracic acid, a silicon compound, an aluminum compound and a gallium compound;
(2) overheating at a temperature higher than an initial growth temperature of the crystal by 20 to 100° C. for 5 to 30 days, then putting a seed rod or a seed rod with a seed crystal into the melt after cooling to a temperature higher than the initial growth temperature of the crystal by 10 to 30° C. slowly, and keeping a constant temperature for 10 to 30 minutes, and again cooling to a temperature higher than the initial growth temperature of the crystal by 0 to 10° C., then single crystals immediately beginning to grow, and rotating the seed rod at a rate of 5 to 30 r/min; simultaneously, cooling at a rate of 0.1 to 3° C./day; stopping rotating and statically growing after cooling for 5 to 30 days, and continuing to cool at a rate of 0.1 to 3° C./day, and stopping heating when a single crystal grows to a required size, and the grown single crystal being taken away from a melt surface and being slowly cooled to room temperature.

14. The preparation method for doped low-temperature phase barium metaborate single crystal according to claim 3, the flux czochralski method comprises the following steps:
(1) grinding and mixing raw materials and a flux in a certain ratio to obtain a mixture, and pouring the mixture into a platinum crucible after melting, then the platinum crucible being put in a molten salt furnace to obtain a melt; the raw materials being barium carbonate, boracic acid, a silicon compound, an aluminum compound and a gallium compound;
(2) overheating for 5 to 30 days at a temperature higher than an initial growth temperature of the crystal by 20 to 80° C., then a seed rod with a seed being connected with a crystal-supported rod rotating pulling motor and slowly put in the melt after slowly cooling to a temperature higher than the initial growth temperature of the crystal by 10 to 30° C.; keeping a constant temperature for 10 to 30 minutes at a temperature higher than the initial growth temperature of the crystal by 10 to 30° C., then cooling to a temperature higher than the initial growth temperature of the crystal by 0 to 10° C., a single crystal beginning to statically grow; simultaneously, cooling at a rate of 0.1 to 3° C. per day; cooling for 5 to 30 days, the seed rod being rotated at a rate of 6 to 30 r/min, and being pulled up by 0.2 mm everyday, and continuing to cool at a rate of 0.1 to 3° C. per day, stopping heating when the single crystal growing to a required size, and the grown single crystal being taken away from a melt surface and cooled to room temperature slowly.

15. A frequency-converter prepared by the doped low-temperature phase barium metaborate single crystal according to claim 1.

16. The frequency-converter according to claim 15, wherein the frequency-converter is a double frequency-converter, a triplicate frequency-converter or a fourfold frequency-converter.

17. The frequency-converter according to claim 16, wherein
in the double frequency-converter, an included angle between a light pass surface of the double frequency-converter and a crystal growth surface perpendicular to an C-axis is an arbitrary angle in a range of 14.5° to 22.5°, and two pass surfaces are polished;
in the triplicate frequency-converter, an included angle between light pass surfaces of the triplicate frequency-converter and crystal growth surfaces perpendicular to an C-axis is an arbitrary angle in a range of 24° to 32°, and two pass surfaces are polished;
in the fourfold frequency-converter, an included angle between light pass surfaces of the fourfold frequency-converter and crystal growth surfaces perpendicular to an C-axis is an arbitrary angle in a range of 43° to 51°, and two pass surfaces are polished.

* * * * *